(12) United States Patent
Gotou et al.

(10) Patent No.: US 11,392,737 B2
(45) Date of Patent: Jul. 19, 2022

(54) DETECTION APPARATUS, DETECTION METHOD, AND RECORDING MEDIUM THAT RECORDS DETECTION PROGRAM

(71) Applicant: YOKOGAWA ELECTRIC CORPORATION, Tokyo (JP)

(72) Inventors: Hirotsugu Gotou, Tokyo (JP); Kazutoshi Kodama, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 277 days.

(21) Appl. No.: 16/706,791

(22) Filed: Dec. 8, 2019

(65) Prior Publication Data

US 2020/0193076 A1 Jun. 18, 2020

(30) Foreign Application Priority Data

Dec. 12, 2018 (JP) .............................. JP2018-232163

(51) Int. Cl.
*G05B 23/02* (2006.01)
*G06F 30/27* (2020.01)
(Continued)

(52) U.S. Cl.
CPC ........... *G06F 30/27* (2020.01); *G01M 99/005* (2013.01); *G05B 23/0243* (2013.01);
(Continued)

(58) Field of Classification Search
USPC ...................................................... 702/183
See application file for complete search history.

(56) References Cited

U.S. PATENT DOCUMENTS

| 10,525,563 B2 | 1/2020 | Yamamoto |
| 2007/0028219 A1 | 2/2007 | Miller |

(Continued)

FOREIGN PATENT DOCUMENTS

| JP | 2004186445 A | 7/2004 |
| JP | 2006276924 A | 10/2006 |

(Continued)

OTHER PUBLICATIONS

Kazutoshi Kodama, "The Sushi Sensor and Machine Learning for Achieving Condition-based Maintenance (CBM)", Yokogawa Technical Report, vol. 61, No. 1 (2018), pp. 25-28.

(Continued)

*Primary Examiner* — Paul D Lee

(57) ABSTRACT

In a detection apparatus that detects an anomaly of equipment, in a case where a plurality of types of anomalies occur, it is desired to detect which type of anomaly has occurred. Provided is a detection apparatus that includes a sensor data obtaining unit configured to obtain sensor data of a sensor installed in equipment, a model storage unit configured to store detection models that are individually trained for each anomaly using the sensor data in an anomaly period in which the anomaly has occurred, for a plurality of types of respective anomalies of the equipment, and a detection unit configured to detect presence or absence of the plurality of types of respective anomalies from the sensor data that has been newly obtained, by using the detection models corresponding to the plurality of types of respective anomalies.

18 Claims, 8 Drawing Sheets

(51) Int. Cl.
*G06N 20/00* (2019.01)
*G01M 99/00* (2011.01)
*G06N 3/04* (2006.01)

(52) U.S. Cl.
CPC ......... *G05B 23/0275* (2013.01); *G06N 20/00* (2019.01); *G06N 3/04* (2013.01)

(56) References Cited

U.S. PATENT DOCUMENTS

| | | |
|---|---|---|
| 2011/0264424 A1 | 10/2011 | Miwa |
| 2012/0166142 A1 | 6/2012 | Maeda |
| 2015/0279129 A1 | 10/2015 | Ishikawa |
| 2016/0342903 A1* | 11/2016 | Shumpert ............. G06F 11/079 |
| 2018/0100784 A1 | 4/2018 | Patil |
| 2018/0247220 A1* | 8/2018 | Assem Aly Salama ..................... G06N 20/00 |
| 2018/0348747 A1 | 12/2018 | Lavid Ben Lulu |
| 2020/0019852 A1* | 1/2020 | Yoon ...................... G06N 20/00 |

FOREIGN PATENT DOCUMENTS

| | | |
|---|---|---|
| JP | 2009054843 A | 3/2009 |
| JP | 2010122847 A | 6/2010 |
| JP | 2011059790 A | 3/2011 |
| WO | 2018030033 A1 | 2/2018 |

OTHER PUBLICATIONS

Extended European Search Report for European Patent Application No. 19214089.5, issued by the European Patent Office dated Apr. 7, 2020.

Office Action issued for counterpart Japanese Application No. 2018-232163, issued by the Japan Patent Office dated Jan. 26, 2021 (drafted on Jan. 18, 2021).

* cited by examiner

| DETECTION MODEL | ANOMALY TYPE | MESSAGE | COUNTERMEASURE INFORMATION | INSTANCE INFORMATION | DESTINATION INFORMATION |
|---|---|---|---|---|---|
| DETECTION MODEL 1 | A | OIL LEAKAGE FROM ○○ OCCURS | FASTEN BOLT OF ○○ AGAIN | xxxxx | ~ |
| DETECTION MODEL 2 | B | FAILURE DUE TO ABRASION OF △△ OCCURS | REPLACE PARTS OF △△ | xxxxx | ~ |
| DETECTION MODEL 3 | C | BEARING ANOMALY OF □□ OCCURS | REPLACE LOCATION OF □□ AFTER SUSPENSION | xxxxx | ~ |
| ... | ... | ... | ... | ... | ... |
| DETECTION MODEL n | ***** | ***** | ***** | ***** | ***** |

FIG. 4

DETECTION APPARATUS, DETECTION METHOD, AND RECORDING MEDIUM THAT RECORDS DETECTION PROGRAM

The contents of the following Japanese patent application(s) are incorporated herein by reference:
2018-232163 filed in JP on Dec. 12, 2018

1. TECHNICAL FIELD

The present invention relates to a detection apparatus, a detection method, and a recording medium having recorded therein a detection program.

2. RELATED ART

Up to now, a detection apparatus has been proposed which detects an anomaly of equipment from data of a sensor installed in the equipment by using a detection model trained by machine learning.
NPL 1 Kazutoshi Kodama, "The Sushi Sensor and Machine Learning for Achieving Condition-based Maintenance (CBM)", Yokogawa Technical Report, Vol. 61, No. 1 (2018), pp. 25-28

However, in the detection apparatus that detects the anomaly of the equipment, in a case where a plurality of types of anomalies occur, it is desired to detect which type of anomaly has occurred.

SUMMARY

To address the above-mentioned issue, according to a first aspect of the present invention, there is provided a detection apparatus. The detection apparatus may include a sensor data obtaining unit configured to obtain sensor data of a sensor installed in equipment. The detection apparatus may include a model storage unit configured to store detection models that are individually trained for each anomaly using the sensor data in an anomaly period in which the anomaly has occurred, for a plurality of types of respective anomalies of the equipment. The detection apparatus may include a detection unit configured to detect presence or absence of the plurality of types of respective anomalies from the sensor data that has been newly obtained, by using the detection models corresponding to the plurality of types of respective anomalies.

The detection apparatus may further include an output unit configured to output information indicating a type of a detected anomaly in accordance with a detection result of the detection unit.

The model storage unit may store the detection models individually trained for each anomaly and countermeasure information recommended in a case where the respective anomalies have occurred, the detection models and the countermeasure information being respectively associated with each other, and in a case where an anomaly is detected, the output unit may output the countermeasure information corresponding to the detected anomaly.

The model storage unit may store the detection models individually trained for each anomaly and instance information related to instances where anomalies that are same as or similar to the respective anomalies have occurred in a past, the detection models and the instance information being respectively associated with each other, and in a case where an anomaly is detected, the output unit may output the instance information corresponding to the detected anomaly.

The model storage unit may store the detection models individually trained for each anomaly and destination information on destinations to which anomaly occurrences are reported in a case where the respective anomalies have occurred, the detection models and the destination information being respectively associated with each other, and in a case where an anomaly is detected, the output unit may report the anomaly occurrence using the destination information corresponding to the detected anomaly.

The detection apparatus may further include an anomaly information obtaining unit configured to obtain specifications of the anomaly periods for the plurality of types of respective anomalies.

The detection apparatus may further include a training unit configured to individually train the detection models for each anomaly using the sensor data in the anomaly period for the plurality of types of respective anomalies.

The detection apparatus may further include a model obtaining unit configured to obtain the detection models corresponding to the plurality of types of respective anomalies from another apparatus.

The detection apparatus may further include a detector configured to detect an anomaly of the equipment under a predetermined condition, and an anomaly of the equipment may be detected based on detection results of the detection unit and the detector.

The model storage unit may further store a universal anomaly model for detecting all of the plurality of types of anomalies, and in a case where an anomaly of the equipment is detected by using the universal anomaly model, the detection unit may detect presence or absence of the plurality of types of respective anomalies by using the detection models corresponding to the plurality of types of respective anomalies.

According to a second aspect of the present invention, there is provided a detection method for a detection apparatus to detect an anomaly of equipment. The detection method may include causing the detection apparatus to obtain sensor data from a sensor installed in equipment. The detection method may include causing the detection apparatus to store detection models that are individually trained for each anomaly using the sensor data in an anomaly period in which the anomaly has occurred, for a plurality of types of respective anomalies of the equipment. The detection method may include causing the detection apparatus to detect presence or absence of the plurality of types of respective anomalies from the sensor data that has been newly obtained, by using the detection models corresponding to the plurality of types of respective anomalies.

According to a third aspect of the present invention, there is provided a recording medium having recorded therein a detection program. The detection program may be executed by a computer. The detection program may cause the computer to function as a sensor data obtaining unit configured to obtain sensor data from a sensor installed in equipment. The detection program may cause the computer to function as a model storage unit configured to store detection models that are individually trained for each anomaly using the sensor data in an anomaly period in which the anomaly has occurred, for a plurality of types of respective anomalies of the equipment. The detection program may cause the computer to function as a detection unit configured to detect presence or absence of the plurality of types of respective anomalies from the sensor data that has been newly obtained, by using the detection models corresponding to the plurality of types of respective anomalies.

The summary clause does not necessarily describe all necessary features of the embodiments of the present invention. The present invention may also be a sub-combination of the features described above.

BRIEF DESCRIPTION OF THE DRAWINGS

FIG. 4 illustrates an example in which a model storage unit 150 of the detection apparatus 100 according to the modified example stores a detection model and additional information while being associated with each other.

DESCRIPTION OF EXEMPLARY EMBODIMENTS

Hereinafter, the present invention will be described by way of embodiments of the invention, but the following embodiments are not intended to restrict the invention in the scope of claims. In addition, not all combinations of features described in the embodiments necessarily have to be essential to solving means of the invention.

Figure 1:
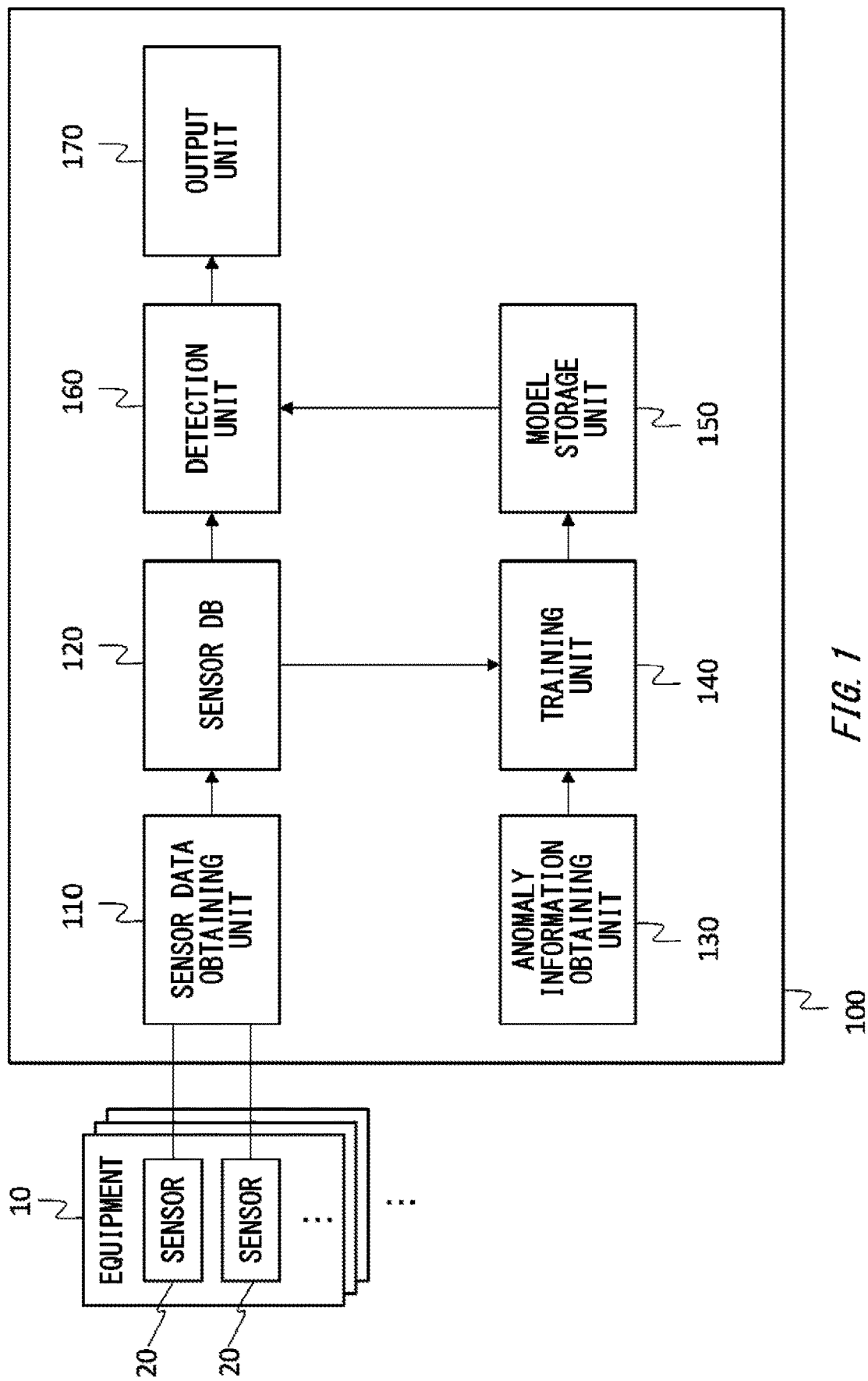
FIG. 1 illustrates a detection apparatus 100 according to the present embodiment together with equipment 10.

FIG. 1 illustrates a detection apparatus 100 according to the present embodiment together with equipment 10. The detection apparatus 100 according to the present embodiment detects the presence or absence of each of a plurality of types of respective anomalies from data of a sensor 20 installed in the equipment 10 by using detection models corresponding to the plurality of types of respective anomalies of the equipment 10. Accordingly, the detection apparatus 100 according to the present embodiment can grasp which anomaly has occurred in the equipment 10, and when the anomaly occurs in the equipment 10, it is possible to shorten time for an operator to investigate a cause of the anomaly that has occurred.

The equipment 10 is, for example, at least part of a plant such as a factory facility, a machinery facility, a production facility, a power generation facility, and a storage facility. The equipment 10 may be a control target in the plant. The equipment 10 may be, for example, at least part of the factory facility, the machinery facility, the production facility, the power generation facility, the storage facility, or the like. In addition, the equipment 10 may include one or a plurality of apparatuses. The equipment 10 may also be, for example, ventilation and illumination in a building, and equipment in water and sewerage facilities, a dam, a farm facility, a bridge, a tunnel, or the like, other than plants.

The sensor 20 is installed in the equipment 10. The sensor 20 may be a single sensor or a plurality of sensors, and the plurality of sensors 20 may also be installed in the multiple equipment 10. The sensor 20 is, for example, an Industrial Internet of Things (Industrial IoT: IIoT) sensor. The sensor 20 may be a vibration sensor, a temperature sensor, a pressure sensor, a flow rate sensor, a gas sensor, a noise sensor, a distortion sensor, a corrosion sensor, a pH sensor, or the like, and measures various physical quantities for maintenance of the equipment 10 and environmental monitoring. The sensor 20 is preferably a sensor that is satisfactory in environment resistance (such as water proof, dust proof, and explosion proof) and can also be easily installed outside. In addition, the sensor 20 may be a sensor compatible with wide-area wireless communication to provide a wireless solution. The sensor 20 may be, for example, a sensor compatible with LoRaWAN (registered trademark) corresponding to one of low power wide areas (LPWA). In addition, the sensor 20 may also be a sensor that is compatible with near field communication (NFC) and may perform sensor setting and data monitoring from an application on a smartphone.

The detection apparatus 100 detects the presence or absence of each of the plurality of types of respective anomalies of the equipment 10 from the data of the sensor 20 by using the detection models corresponding to the plurality of types of respective anomalies of the equipment 10. The detection apparatus 100 may also be a computer such as a personal computer (PC), a tablet type computer, a smartphone, a work station, a server computer, or a general purpose computer, or may also be a computer system to which a plurality of computers are connected. The above-mentioned computer system is also a broadly-defined computer. In addition, the detection apparatus 100 may also be implemented by one or a plurality of virtual computer environments that can be executed in a computer. Instead of this, the detection apparatus 100 may also be a dedicated computer designed to detect an anomaly of the equipment 10 or may also be dedicated hardware realized by dedicated circuitry.

In addition, the detection apparatus 100 may also be an apparatus installed on an on premise local server, may also be an apparatus installed on distributed servers of edge computing, or may also be a cloud computing system installed on a cloud environment.

The detection apparatus 100 includes a sensor data obtaining unit 110, a sensor database 120, an anomaly information obtaining unit 130, a training unit 140, a model storage unit 150, a detection unit 160, and an output unit 170.

The sensor data obtaining unit 110 obtains the sensor data of the sensor 20 installed in the equipment 10. The sensor data obtaining unit 110 may be, for example, a unit realized by installing an interface including a function for operating in cooperation with an application configured to perform data analysis into a cloud environment or a server, and may obtain sensor data indicating various physical quantities measured by the sensor 20 via a LoRaWAN gateway. Then, the sensor data obtaining unit 110 supplies the sensor data obtained from the sensor 20 to the sensor database 120.

The sensor database 120 stores the sensor data supplied from the sensor data obtaining unit 110. In addition, the sensor database 120 supplies the stored sensor data to the training unit 140 and the detection unit 160.

The anomaly information obtaining unit 130 obtains specifications of anomaly periods for the plurality of types of respective anomalies. For example, when the operator detects that an anomaly has occurred in the equipment 10, the operator specifies an anomaly period as a period in which the anomaly has occurred for each anomaly. Then, the anomaly information obtaining unit 130 obtains anomaly information including the anomaly periods specified by the operator as the periods in which the respective anomalies have occurred via a user interface, various recording media, a network, or the like for each anomaly type. The anomaly information obtaining unit 130 supplies the obtained anomaly information for the plurality of types of respective anomalies to the training unit 140.

The training unit 140 individually trains the detection models for each anomaly using the sensor data in the anomaly period for the plurality of types of respective anomalies. The training unit 140 identifies, for example, the anomaly periods in which the respective anomalies have occurred from anomaly information supplied from the anomaly information obtaining unit 130 for each anomaly type. Next, the training unit 140 assigns an "anomaly" label to the sensor data corresponding to the anomaly period among the sensor data supplied from the sensor database 120 for the plurality of types of respective anomalies. Then, the training unit 140 obtains teaching data while the sensor data to which the "anomaly" label is assigned is set as an abnormal value, and the sensor data to which the "anomaly" label is not assigned is set as a normal value, and trains the detection modes for detecting the occurrence of each of the plurality of types of respective anomalies. For example, the sensor data obtaining unit 110 may also associate sensor data with a data obtaining date on which the sensor data is obtained, and the training unit 140 may also compare the data obtaining date with the anomaly period, and in a case where both are matched with each other, assign the "anomaly" label to the sensor data with which the data obtaining date is associated to train the detection model. It is noted that, in the above-described explanation, a case has been illustrated as an example where the detection apparatus 100 implicitly identifies the sensor data to which the "anomaly" label is not assigned as the normal value by using only the "anomaly" label. However, the detection apparatus 100 may also explicitly identify both anomaly and normality and perform training of the detection models by using the "normality" label in addition to the "anomaly" label.

In addition, the training unit 140 may use various algorithms when the detection models are trained. The training unit 140 may use, for example, a regression analysis, a cluster analysis, a principal component analysis, vector quantification, a self-organizing map, a neural network, a support vector machine, ID3, a naive Bayes classifier, or the like as training algorithms. Then, the training unit 140 supplies the trained detection models corresponding to the plurality of types of respective anomalies to the model storage unit 150.

The model storage unit 150 stores the detection models individually generated for each anomaly based on the sensor data in the anomaly period in which the anomaly has occurred, for the plurality of types of respective anomalies of the equipment 10. In particular, the model storage unit 150 stores the detection models that are individually trained for each anomaly using the sensor data in the anomaly period in which the anomaly has occurred, for the plurality of types of respective anomalies of the equipment 10. The model storage unit 150 stores, for example, the detection models corresponding to the plurality of types of respective anomalies which are trained and supplied by the training unit 140. When the detection models are stored, the model storage unit 150 may store the detection models individually trained for each anomaly, in association with various additional information. This will be described below. Then, the model storage unit 150 supplies the detection models corresponding to the plurality of types of respective anomalies to the detection unit 160.

The detection unit 160 detects the presence or absence of each of the plurality of types of respective anomalies from the sensor data that has been newly obtained by the sensor data obtaining unit 110, by using the detection models corresponding to the plurality of types of respective anomalies. The detection unit 160 detects the presence or absence of each of the plurality of types of respective anomalies from the sensor data that has been newly obtained from the sensor database 120, for example, by using the detection models corresponding to the plurality of types of respective anomalies which are supplied from the model storage unit 150. Then, the detection unit 160 supplies a detection result to the output unit 170.

The output unit 170 outputs the information indicating the type of the detected anomaly in accordance with the detection result of the detection unit 160. The output unit 170 may also display, for example, the information indicating the type of the detected anomaly on a monitor or may also display the information by using an indicating lump in a different mode for each anomaly. In addition, the output unit 170 may also set an alarm in a different mode for each anomaly. Instead of or in addition to this, the output unit 170 may also report the information indicating the type of the anomaly to another apparatus in a wired or wireless manner.

Figure 2:
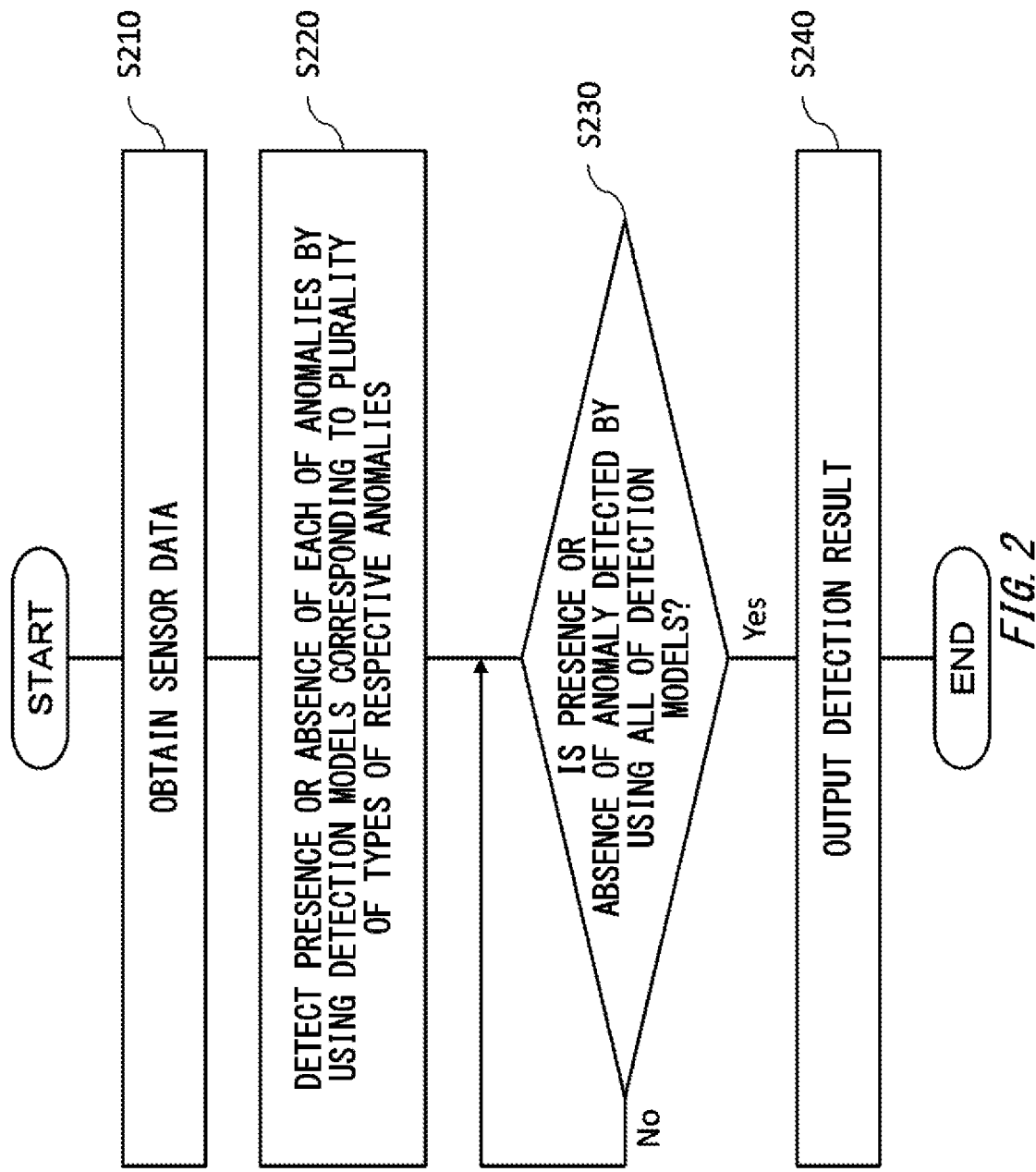
FIG. 2 illustrates an example of a flow for the detection apparatus 100 according to the present embodiment to detect an anomaly of the equipment 10.

FIG. 2 illustrates an example of a flow for the detection apparatus 100 according to the present embodiment to detect an anomaly of the equipment 10. The detection apparatus 100 detects the anomaly of the equipment 10 by executing the flow illustrated in FIG. 2.

In step 210, the sensor data obtaining unit 110 obtains the sensor data from the sensor 20 installed in the equipment 10. Then, the sensor data obtaining unit 110 supplies the obtained sensor data to the sensor database 120.

In step 220, the detection unit 160 detects the presence or absence of each of the plurality of types of respective anomalies from the sensor data that has been newly obtained from the sensor database 120 by using the detection models corresponding to the plurality of types of respective anomalies which are supplied from the model storage unit 150.

In step 230, the detection unit 160 determines whether or not the presence or absence of each of the anomalies is detected by using all of the detection models corresponding to the plurality of types of respective anomalies. In step 230, in a case where it is determined that the presence or absence of each of the anomalies is not detected, the detection unit 160 repeats step 230.

On the other hand, in a case where it is determined that the presence or absence of each of the anomalies is detected, in step 240, the output unit 170 outputs the information indicating the type of the detected anomaly in accordance with the detection result by the detection unit 160, and ends the process. At this time, the output unit 170 may output the information indicating types of all of detected anomalies in accordance with the detection results by the detection unit 160. That is, in a case where a plurality of anomalies are detected, the output unit 170 may output the information indicating the types of the plurality of anomalies.

A detection apparatus in a related art can detect that some anomaly has occurred in equipment from data of a sensor installed in the equipment, but is not able to detect which anomaly has occurred. Therefore, the operator is requested to examine a cause in a case where an anomaly has occurred and investigate what is happening in the equipment. However, in accordance with the detection apparatus 100 according to the present embodiment, the presence or absence of each of the plurality of types of respective anomalies is detected by using the detection models, which are individually trained for each anomaly, corresponding to the plurality of types of respective anomalies from the same data group. Therefore, the operator can easily grasp which anomaly has occurred in the equipment 10 and shorten a time for investigating the anomaly cause.

In addition, up to now, accuracy for the anomaly detection in the equipment depends on an experience or hunch of the operator, and it is not easy to improve the accuracy. However, in accordance with the detection apparatus 100 according to the present embodiment, the presence or absence of each of the plurality of types of respective anomalies is detected by using the detection models individually trained for each anomaly. Therefore, it is possible to reduce a fluctuation in quality for the anomaly detection based on skills or experiences of individuals.

Figure 3:
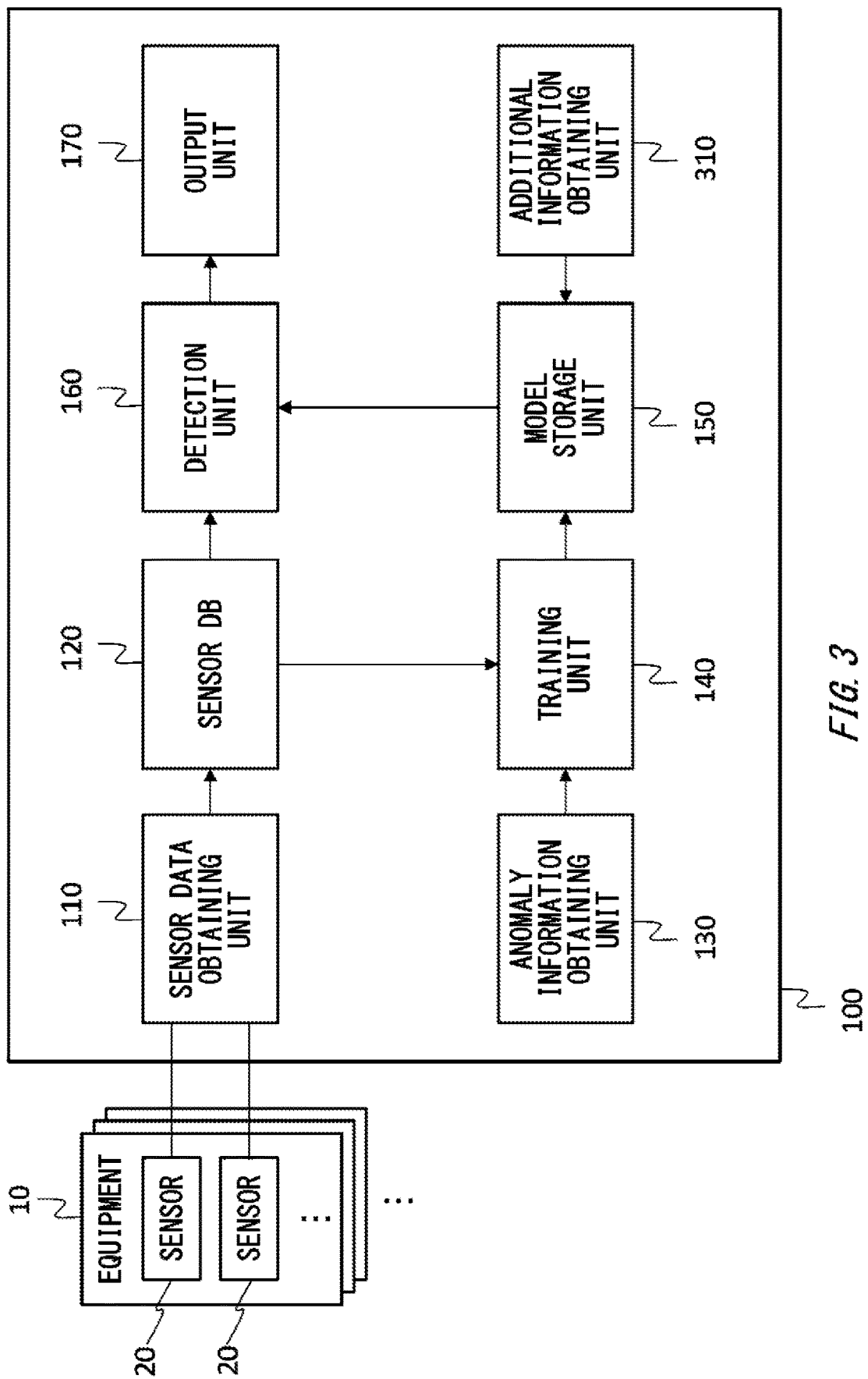
FIG. 3 illustrates a first example of the detection apparatus 100 according to a modified example of the present embodiment.

FIG. 3 illustrates a first example of the detection apparatus 100 according to a modified example of the present embodiment. In this drawing, members including the same functions and configurations as FIG. 1 are assigned with the same reference signs, and descriptions thereof will be omitted below except for differences. In this drawing, the detection apparatus 100 further includes an additional information obtaining unit 310.

The additional information obtaining unit 310 obtains the additional information corresponding to the respective anomalies, for example, via a user interface, various recording media, and a network. The additional information obtaining unit 310 obtains, as the additional information, for example, messages that are to be output in a case where the respective anomalies have occurred, countermeasure information that are to be adopted in a case where the respective anomalies have occurred, instance information indicating that anomalies that are the same as or similar to the respective anomalies have occurred in the past, and destination information on destinations to which anomaly occurrences are to be reported in a case where the respective anomalies have occurred. At this time, the additional information obtaining unit 310 may also obtain these information themselves or may also obtain information indicating link destinations of these information. Then, the additional information obtaining unit 310 supplies the obtained additional information to the model storage unit 150.

FIG. 4 illustrates an example in which the model storage unit 150 of the detection apparatus 100 according to the modified example stores the detection model and the additional information while being associated with each other. The model storage unit 150 stores the detection models individually trained for each anomaly, in association with anomaly types (for example, A indicates oil, B indicates abrasion, and C indicates shaft bearing in FIG. 4). In addition to this, as illustrated in this drawing, the model storage unit 150 of the detection apparatus 100 according to the present modified example stores the detection models individually trained for each anomaly and the messages to be output in a case where the respective anomalies have occurred while being respectively associated with each other. In addition, the model storage unit 150 stores the detection models individually trained for each anomaly and the countermeasure information that are to be adopted in a case where the respective anomalies have occurred while being respectively associated with each other. In addition, the model storage unit 150 stores the detection models individually trained for each anomaly and instance information related to instances where anomalies that are the same as or similar to the respective anomalies have occurred in the past while being respectively associated with each other. For example, the instance information includes "oil leaked in equipment 1, and personnel called Z from equipment division responded on day O, month O, year O", and the like. In addition, the model storage unit 150 stores the detection models individually trained for each anomaly and destination information on destinations to which anomaly occurrences are reported in a case where the respective anomalies have occurred while being respectively associated with each other.

Then, in a case where an anomaly is detected based on the information stored in the model storage unit 150, the output unit 170 of the detection apparatus 100 according to the present modified example outputs the message corresponding to the detected anomaly. In addition, in a case where an anomaly is detected, the output unit 170 outputs the countermeasure information corresponding to the detected anomaly. In addition, in a case where an anomaly is detected, the output unit 170 outputs the instance information corresponding to the detected anomaly. In addition, in a case where an anomaly is detected, the output unit 170 reports the anomaly occurrence using the destination information corresponding to the detected anomaly.

In this manner, in accordance with the detection apparatus 100 according to the present modified example, since at least any one of the message, the countermeasure information, the instance information, and the like corresponding to the detected anomaly is also output in addition to the type of the detected anomaly, the operator can grasp the anomaly in detail and also find which action is to take against the anomaly in a case where the anomaly has occurred. In addition, in accordance with the detection apparatus 100 according to the present modified example, the destination to which the anomaly occurrence is reported can be varied according to the detected anomaly, the report can be reliably performed to the person intended to receive the report of the anomaly occurrence. In addition, in accordance with the detection apparatus 100 according to the present modified example, since data such as the incident information can also be shared between plants via a communication network using cloud, efficient operations in a plurality of similar plants and equipment can be performed, and it is possible to improve operational efficiency over the entirety of business and enterprise.

Figure 5:
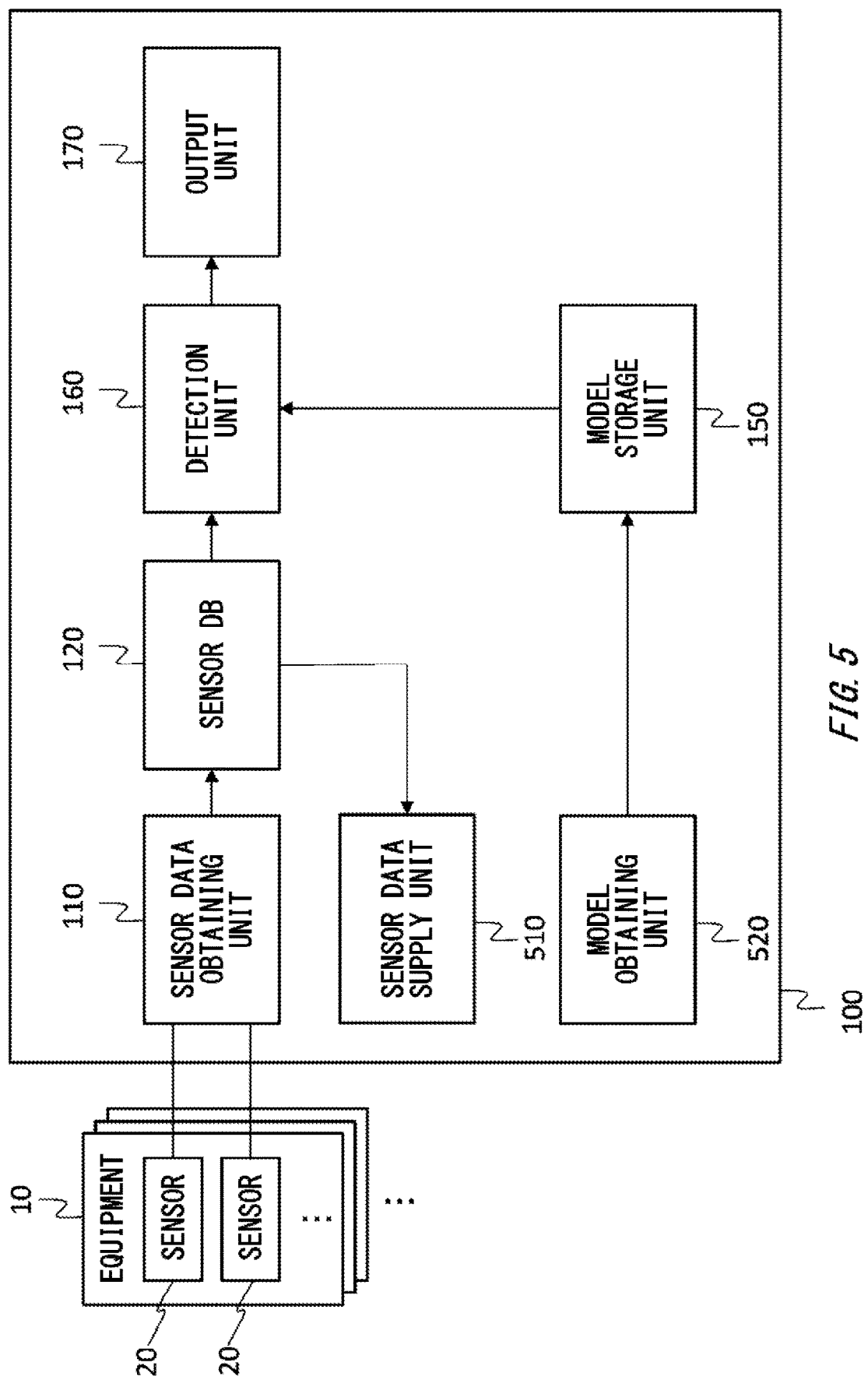
FIG. 5 illustrates a second example of the detection apparatus 100 according to the modified example of the present embodiment.

FIG. 5 illustrates a second example of the detection apparatus 100 according to the modified example of the present embodiment. In this drawing, members including the same functions and configurations as FIG. 1 are assigned with the same reference signs, and descriptions thereof will be omitted below except for differences. In the above-described explanation, a case where the detection apparatus 100 trains the detection models within its own apparatus has been illustrated as an example, but as in the present modified example, the detection apparatus 100 may also cause another apparatus to train detection models and may also use the detection models trained by the other apparatus. In this drawing, the detection apparatus 100 includes a sensor data supply unit 510 and a model obtaining unit 520 instead of the anomaly information obtaining unit 130 and the training unit 140.

The sensor data supply unit 510 obtains the stored sensor data stored in the sensor database 120. Then, the sensor data supply unit 510 supplies the obtained sensor data to the other apparatus via various recording media and a network, for example.

The model obtaining unit 520 obtains the detection models corresponding to the plurality of types of respective anomalies from the other apparatus. The model obtaining unit 520 obtains, for example, the detection models for the respective anomalies from the other apparatus which have been learnt by the other apparatus using the sensor data supplied from the sensor data supply unit 510 via a user interface, various recording media, and a network. Then, the model obtaining unit 520 supplies the obtained detection models corresponding to the plurality of types of respective anomalies to the model storage unit 150. It is noted that, in addition to the obtainment of the sensor data from the sensor data supply unit 510, the other apparatus may also obtain an output signal from the sensor directly or via a network or the like.

Accordingly, the detection apparatus 100 according to the present modified example can cause the other apparatus to perform processing related to the training of the detection models. In general, processing for generating models by machine learning from a vast amount of data uses high processing load. When the detection apparatus 100 according to the present modified example causes the other apparatus to perform the above-mentioned processing involving the high load, the processing load can be distributed. In addition, the detection apparatus 100 according to the present modified example does not need to have a high processing performance for the training, reduction in a size and a weight of the apparatus and cost reduction can be realized.

Figure 6:
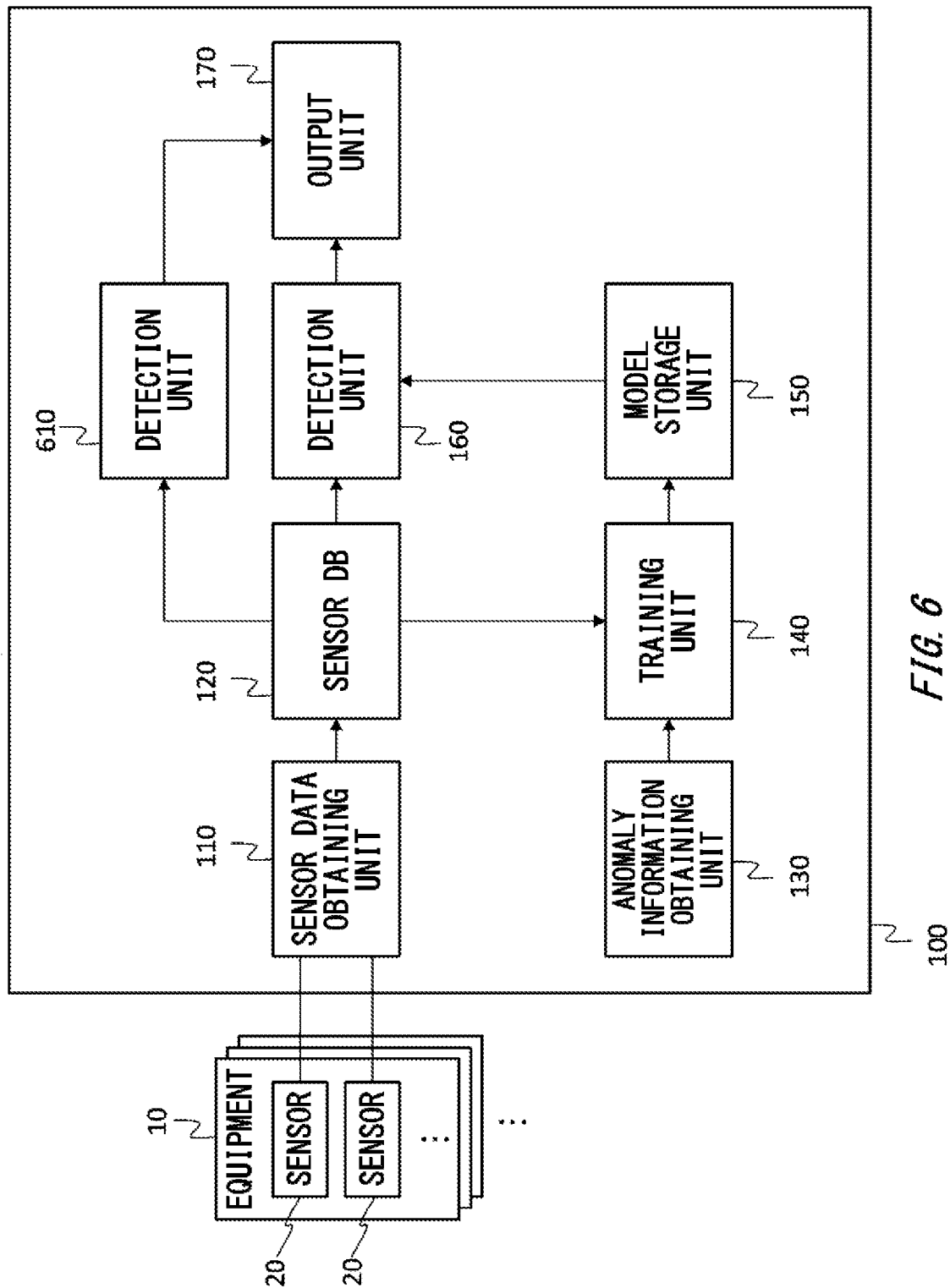
FIG. 6 illustrates a third example of the detection apparatus 100 according to the modified example of the present embodiment.

FIG. 6 illustrates a third example of the detection apparatus 100 according to the modified example of the present embodiment. In this drawing, members including the same functions and configurations as FIG. 1 are assigned with the same reference signs, and descriptions thereof will be omitted below except for differences. In this drawing, the detection apparatus 100 further includes a detector 610. The detection apparatus 100 according to the present modified example detects an anomaly of the equipment 10 based on detection results of the detection unit 160 and the detector 610.

The sensor database 120 of the detection apparatus 100 according to the present modified example supplies the stored sensor data to the detector 610 in addition to the training unit 140 and the detection unit 160.

The detector 610 detects an anomaly of the equipment 10 under a predetermined condition. The detector 610 may be a previously embedded logic such as a logical circuit or a logical program for detecting the anomaly of the equipment 10 under the predetermined condition. The detector 610 detects the presence or absence of the anomaly of the equipment 10 from the sensor data that has been newly obtained from the sensor database 120, by using the previously embedded logic. Then, the detector 610 supplies a detection result to the output unit 170.

The output unit 170 of the detection apparatus 100 according to the present modified example outputs the information indicating the type of the detected anomaly in accordance with the detection results of the detection unit 160 and the detector 610.

As described above, the detection apparatus 100 according to the present modified example detects the anomaly of the equipment 10 based on the detection results of both the detection unit 160 that detects the anomaly of the equipment 10 by using the trained detection models and the detector 610 that detects the anomaly of the equipment 10 by using the embedded logic. In this manner, when the detection apparatus 100 according to the present modified example makes the detection process hybrid, a disadvantage based on the training models and a disadvantage based on the embedded logic can be supplemented in a complementary manner, and advantages based on the respective detections can be maximized.

Figure 7:
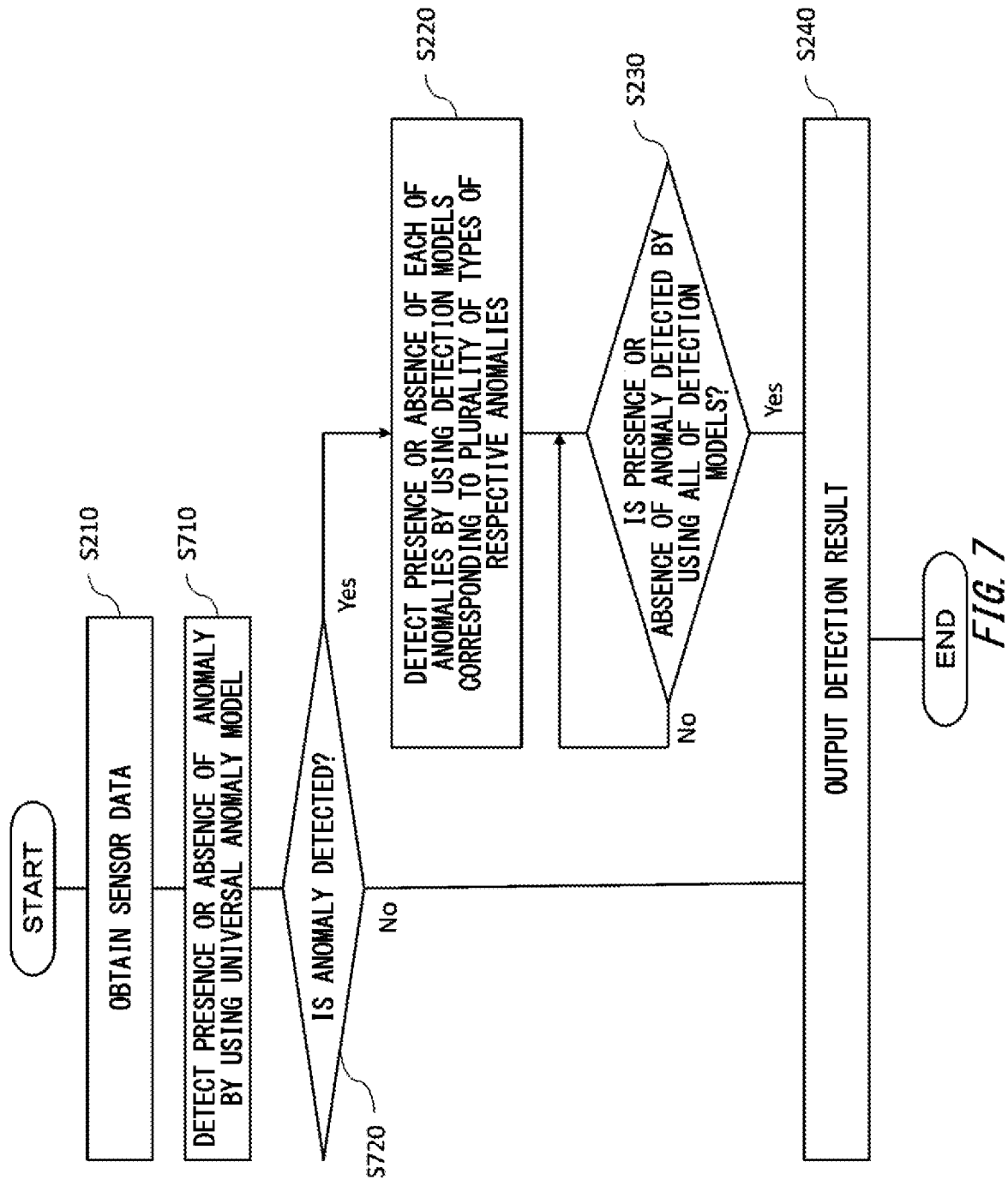
FIG. 7 illustrates another example of the flow for the detection apparatus 100 according to the present embodiment to detect the anomaly of the equipment 10.

FIG. 7 illustrates another example of the flow for the detection apparatus 100 according to the present embodiment to detect the anomaly of the equipment 10. In this drawing, FIG. 2 steps that are the same as those in FIG. 2 are assigned with the same reference signs, and descriptions thereof will be omitted below except for differences. In this drawing, step 710 and step 720 are further included. When the flow in this drawing is executed, the model storage unit 150 further stores a universal anomaly model for detecting all of the plurality of types of anomalies. For example, the training unit 140 assigns the "anomaly" label to the sensor data corresponding to an entire anomaly period obtained by integrating the anomaly periods of the plurality of types of respective anomalies with each other. Next, the training unit 140 trains the universal anomaly model while the sensor data to which the "anomaly" label is assigned is set as annotated data of an abnormal value, and the sensor data to which the "anomaly" label is not assigned is set as annotated data of a normal value. Then, the training unit 140 supplies the universal anomaly model to the model storage unit 150 in addition to the detection models for the respective anomalies. Accordingly, the model storage unit 150 may further store the universal anomaly model in addition to the detection models for the respective anomalies.

When the sensor data is obtained in step 210, the detection unit 160 detects the presence or absence of an anomaly of the equipment 10 by using the universal anomaly model in step 710. That is, before the presence or absence of each of the plurality of types of respective anomalies is detected by using the detection models for the respective anomalies, the detection unit 160 detects the presence or absence of the anomaly of the equipment 10 by using the universal anomaly model. At this time, the detection unit 160 may detect the presence or absence of the anomaly of the equipment 10 by using a threshold different from a threshold used when the presence or absence of each of the plurality of types of respective anomalies is detected. That is, the detection unit 160 may also determine that the anomaly is detected in a case where the anomaly is roughly similar to the model without evaluating a degree of similarity with the universal anomaly model in detail.

In step 720, in a case where it is determined that the anomaly is not detected, the detection unit 160 advances the process to step 240. In step 720, in a case where it is determined that the anomaly is detected, the detection unit 160 advances the process to step 220 and detects the presence or absence of each of the plurality of types of respective anomalies by using the detection models for the respective anomalies.

As described above, in the flow in this drawing, in a case where the anomaly of the equipment 10 is detected by using the universal anomaly model, the detection unit 160 detects the presence or absence of each of the plurality of types of respective anomalies by using the detection models corresponding to the plurality of types of respective anomalies. Accordingly, first, the detection apparatus 100 determines the presence or absence of a broad anomaly by using the universal anomaly model, and detects the presence or absence of each of the plurality of types of respective anomalies by using the detection models for the respective anomalies in a case where an anomaly is suspected. Therefore, it is possible to decrease the number of occasions to detect the presence or absence of each of the plurality of types of respective anomalies in detail by using the detection models for the respective anomalies, and the processing load of the detection apparatus 100 can be suppressed.

Various embodiments of the present invention may be described with reference to flowcharts and block diagrams whose blocks may represent (1) steps of processes in which operations are performed or (2) units of apparatuses responsible for performing operations. Certain steps and units may be implemented by at least any one of dedicated circuitry, programmable circuitry supplied with computer-readable instructions stored on computer-readable media, and processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a Floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 8:
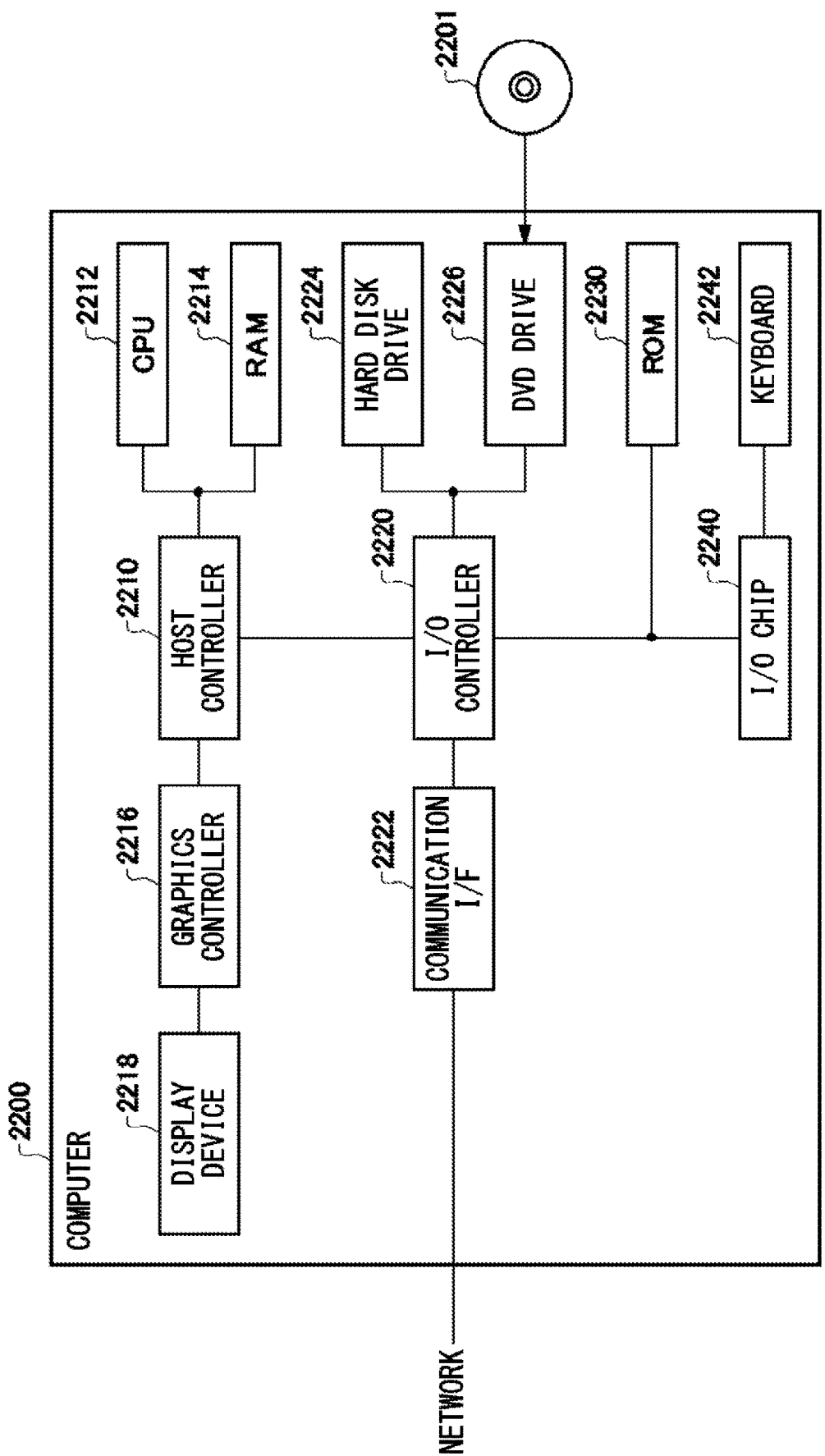
FIG. 8 illustrates an example of a computer 2200 in which aspects of the present invention may be wholly or partly embodied.

FIG. 8 illustrates an example of a computer 2200 in which aspects of the present invention may be wholly or partly embodied. A program that is installed in the computer 2200 can cause the computer 2200 to function as or perform operations associated with apparatuses of the embodiments of the present invention or one or more units thereof, and/or cause the computer 2200 to perform processes of the embodiments of the present invention or steps thereof. Such a program may be executed by a CPU 2212 to cause the computer 2200 to perform certain operations associated with some or all of the blocks of flowcharts and block diagrams described herein.

The computer 2200 according to the present embodiment includes the CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., and perform various types of processing on the data on the RAM 2214. The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS 10 equipment
20 sensor
100 detection apparatus
110 sensor data obtaining unit
120 sensor database
130 anomaly information obtaining unit
140 training unit
150 model storage unit
160 detection unit
170 output unit
310 additional information obtaining unit
510 sensor data supply unit
520 model obtaining unit
610 detector
2200 computer
2201 DVD-ROM
2210 host controller
2212 CPU
2214 RAM
2216 graphics controller
2218 display device
2220 input/output controller
2222 communication interface
2224 hard disc drive
2226 DVD-ROM drive
2230 ROM
2240 input/output chip
2242 keyboard

What is claimed is:

1. A detection apparatus comprising:
a sensor data obtaining unit configured to obtain sensor data of a sensor installed in equipment;
an anomaly information obtaining unit configured to obtain specifications of anomaly periods in which an anomaly has occurred, for a plurality of types of respective anomalies of the equipment;
a training unit configured to individually train, for each anomaly, detection models that detect the plurality of types of respective anomalies using the sensor data in each of the anomaly periods as teaching data;
a model storage unit configured to store the detection models that are individually trained for each anomaly, for the plurality of types of respective anomalies of the equipment; and
a detection unit configured to detect presence or absence of the plurality of types of respective anomalies from the sensor data that has been newly obtained, by using the detection models corresponding to the plurality of types of respective anomalies.

2. The detection apparatus according to claim 1, further comprising:
an output unit configured to output information indicating a type of a detected anomaly in accordance with a detection result of the detection unit.

3. The detection apparatus according to claim 2,
wherein the model storage unit stores the detection models individually trained for each anomaly and countermeasure information recommended in a case where the respective anomalies have occurred, the detection models and the countermeasure information being respectively associated with each other, and
wherein, in a case where an anomaly is detected, the output unit outputs the countermeasure information corresponding to the detected anomaly.

4. The detection apparatus according to claim 2,
wherein the model storage unit stores the detection models individually trained for each anomaly and instance information related to instances where anomalies that are same as or similar to the respective anomalies have occurred in a past, the detection models and the instance information being respectively associated with each other, and
wherein, in a case where an anomaly is detected, the output unit outputs the instance information corresponding to the detected anomaly.

5. The detection apparatus according to claim 2,
wherein the model storage unit stores the detection models individually trained for each anomaly and destination information on destinations to which anomaly occurrences are reported in a case where the respective anomalies have occurred, the detection models and the destination information being respectively associated with each other, and
wherein, in a case where an anomaly is detected, the output unit reports the anomaly occurrence using the destination information corresponding to the detected anomaly.

6. The detection apparatus according to claim 1, further comprising:
a detector configured to detect an anomaly of the equipment under a predetermined condition,
wherein an anomaly of the equipment is detected based on detection results of the detection unit and the detector.

7. The detection apparatus according to claim 1,
wherein the model storage unit further stores a universal anomaly model for detecting all of the plurality of types of anomalies, the universal anomaly model being trained based on a label assigned to sensor data corresponding to an entire anomaly period obtained by integrating anomaly periods of the plurality of types of respective anomalies with each other, and
wherein, in a case where an anomaly of the equipment is detected by using the universal anomaly model, the detection unit detects presence or absence of the plurality of types of respective anomalies by using the detection models corresponding to the plurality of types of respective anomalies.

8. The detection apparatus according to claim 1, wherein:
the anomaly periods of the plurality of types of respective anomalies are integrated with each other.

9. The detection apparatus according to claim 1, wherein:
the training unit further trains a universal anomaly model in addition to the detection models for the plurality of types of respective anomalies, and
the model storage unit stores the universal anomaly model.

10. A detection method for a detection apparatus to detect an anomaly of equipment, the detection method comprising:
causing the detection apparatus to obtain sensor data from a sensor installed in the equipment;
causing the detection apparatus to obtain specifications of anomaly periods in which an anomaly has occurred, for a plurality of types of respective anomalies of the equipment;
causing the detection apparatus to individually train, for each anomaly, detection models that detect the plurality of types of respective anomalies using the sensor data in each of the anomaly periods as teaching data;
causing the detection apparatus to store the detection models that are individually trained for each anomaly, for the plurality of types of respective anomalies of the equipment; and
causing the detection apparatus to detect presence or absence of the plurality of types of respective anomalies from the sensor data that has been newly obtained, by using the detection models corresponding to the plurality of types of respective anomalies.

11. The detection method according to claim 10, further comprising:
integrating the anomaly periods of the plurality of types of respective anomalies with each other.

12. The detection method according to claim 10, further comprising:
causing the detection apparatus to train a universal anomaly model in addition to the detection models for the plurality of types of respective anomalies, and
causing the detection apparatus to store the universal anomaly model.

13. A non-transitory recording medium having recorded therein a detection program which, upon execution by a computer, causes the computer to function as:
a sensor data obtaining unit configured to obtain sensor data of a sensor installed in equipment;
an anomaly information obtaining unit configured to obtain specifications of anomaly periods in which an anomaly has occurred, for a plurality of types of respective anomalies of the equipment;
a training unit configured to individually train, for each anomaly, detection models that detect the plurality of types of respective anomalies using the sensor data in each of the anomaly periods as teaching data;
a model storage unit configured to store the detection models that are individually trained for each anomaly, for the plurality of types of respective anomalies of the equipment; and
a detection unit configured to detect presence or absence of the plurality of types of respective anomalies from the sensor data that has been newly obtained, by using the detection models corresponding to the plurality of types of respective anomalies.

14. The non-transitory recording medium according to claim 13, wherein:
the anomaly periods of the plurality of types of respective anomalies are integrated with each other.

15. The non-transitory recording medium according to claim 13, wherein:
the training unit further trains a universal anomaly model in addition to the detection models for the plurality of types of respective anomalies, and
the model storage unit stores the universal anomaly model.

16. A detection apparatus comprising:
a sensor data obtaining unit configured to obtain sensor data of a sensor installed in equipment;
an anomaly information obtaining unit configured to obtain specifications of anomaly periods in which an anomaly has occurred, for a plurality of types of respective anomalies of the equipment;
a training unit configured to individually train, for each anomaly, detection models that detect the plurality of types of respective anomalies using the sensor data in each of the anomaly periods as teaching data;
a model storage unit configured to store the detection models that are individually generated for each anomaly, for the plurality of types of respective anomalies of the equipment; and
a detection unit configured to detect presence or absence of the plurality of types of respective anomalies from the sensor data that has been newly obtained, by using the detection models corresponding to the plurality of types of respective anomalies.

17. The detection apparatus according to claim 16, wherein:
the anomaly periods of the plurality of types of respective anomalies are integrated with each other.

18. The detection apparatus according to claim 16, wherein:

the training unit further trains a universal anomaly model in addition to the detection models for the plurality of types of respective anomalies, and the model storage unit stores the universal anomaly model.

\* \* \* \* \*